United States Patent [19]

Ports et al.

[11] 4,281,449
[45] Aug. 4, 1981

[54] METHOD FOR QUALIFYING BIASED BURN-IN INTEGRATED CIRCUITS ON A WAFER LEVEL

[75] Inventors: Kenneth A. Ports, Indialantic; Thomas R. St. Clair, Melbourne, both of Fla.

[73] Assignee: Harris Corporation, Melbourne, Fla.

[21] Appl. No.: 106,339

[22] Filed: Dec. 21, 1979

[51] Int. Cl.³ .................................. G01R 31/02
[52] U.S. Cl. .................................. 29/593; 324/52; 324/158 R
[58] Field of Search ............... 29/593; 324/158 F, 52, 324/158 R

[56] References Cited

U.S. PATENT DOCUMENTS

| | | | |
|---|---|---|---|
| 3,303,400 | 2/1967 | Allison | 29/593 |
| 3,493,481 | 2/1970 | Messner | 324/52 X |
| 3,634,930 | 1/1972 | Cranston | 29/593 |
| 3,656,058 | 4/1972 | Leathers | 324/158 F |
| 3,710,251 | 1/1973 | Hagge | 324/158 F |
| 3,755,888 | 9/1973 | Geil | 29/593 |
| 3,803,483 | 4/1974 | McMahon | 324/158 F |

Primary Examiner—Jimmy C. Peters
Attorney, Agent, or Firm—Leitner, Palan, Martin & Bernstein

[57] ABSTRACT

Integrated circuits in dice on a wafer are biased burn-in qualified by providing two sets of conductors connected to each die by fusible elements, biasing the dice using said conductors during the high temperature burn-in, testing the fusible elements, removing the conductors, and testing the circuits.

10 Claims, 2 Drawing Figures

METHOD FOR QUALIFYING BIASED BURN-IN INTEGRATED CIRCUITS ON A WAFER LEVEL

BACKGROUND OF THE INVENTION

The present invention relates generally to qualifying integrated circuits and more particularly to a method of qualifying biased integrated circuits on a wafer level.

Many qualification tests for integrated circuits are performed on the die level once the die is mounted into a package. The packaged die is subjected to a qualifying environment and then tested. Because of the different types of housing, the temperature of the qualifying environment may be limited. Similarly, based on the number of dice from a lot which do not qualify, the decision to scrap, retest, or otherwise treat the total lot is made. Thus, if the dice can be tested at the wafer level, the expense of packaging an unacceptable lot is eliminated.

Many of the qualifying tests for environments performed at the die level require biasing of the die while being subject to a qualifying environment. Two such tests are the biased burn-in qualification and the radiation hard qualification for gamma ray radiation.

Generally for biased burn-in qualification, the individual dice, after being packaged, go through an initial testing of electrical characteristics. After the initial tests of the packaged unit, they are sent to a biased, high temperature burn-in for approximately 168 hours and then returned for testing of their electrical characteristics. Based on the type of failures occurring after the burn-in, all the dice from a given run are shelved for product engineering and failure analysis or subjected to a recycle of biased burn-in. Ultimately based on the failure rate, the whole run may be scrapped based on the failure of a few parts generally greater than five percent. If the biased burned-in testing procedure was conducted at the wafer level, the expense of packaging and re-burn-in are eliminated and an earlier decision on scrapping the run at the wafer level can be made.

SUMMARY OF THE INVENTION

An object of the present invention is to provide a method of preparing the dice on a substrate for biased test qualification at the wafer level.

A further object of the invention is to provide protection of integrated circuits from shorted integrated circuits during the biasing required for a given environmental qualification.

An even further object of the present invention is to provide means for biasing the plurality of integrated circuits on a wafer which is compatible with the integrated circuit fabrication process and which diminishes minimally the surface area available for integrated circuits.

Another object is to provide a test procedure for biased burn-in qualification on the wafer level.

These and other objects of the invention are attained by forming two sets of conductors on the wafer over the scribe line connected to each die. At least one fusible element connects each die to at least one set of conductors. Each of the dice are biased by a voltage applied to a pair of terminals for the two sets of conductors and the wafer is subjected to a qualifying environment during the biasing period. Subsequent to the exposure to the qualifying environments, the fusible elements are tested to determine if they were either initially defective or if they had been blown during biasing, and the disconnected dice are marked. Prior to the circuit testing, the sets of conductors are removed from the wafer as well as the underlying insulative layer to expose the areas in which the wafer is to be scribed. The circuits are then individually tested and marked. The scribed wafer is broken into a plurality of dice and the unmarked dice or qualified integrated circuits are separated from the marked or disqualified dice. The qualified integrated circuits are then assembled into appropriate housings.

For a biased burn-in environment, the wafer is subjected to a high temperature burn-in for an extended period of time, for example, 168 hours during biasing.

DESCRIPTION OF THE PREFERRED EMBODIMENTS

Figure 1:
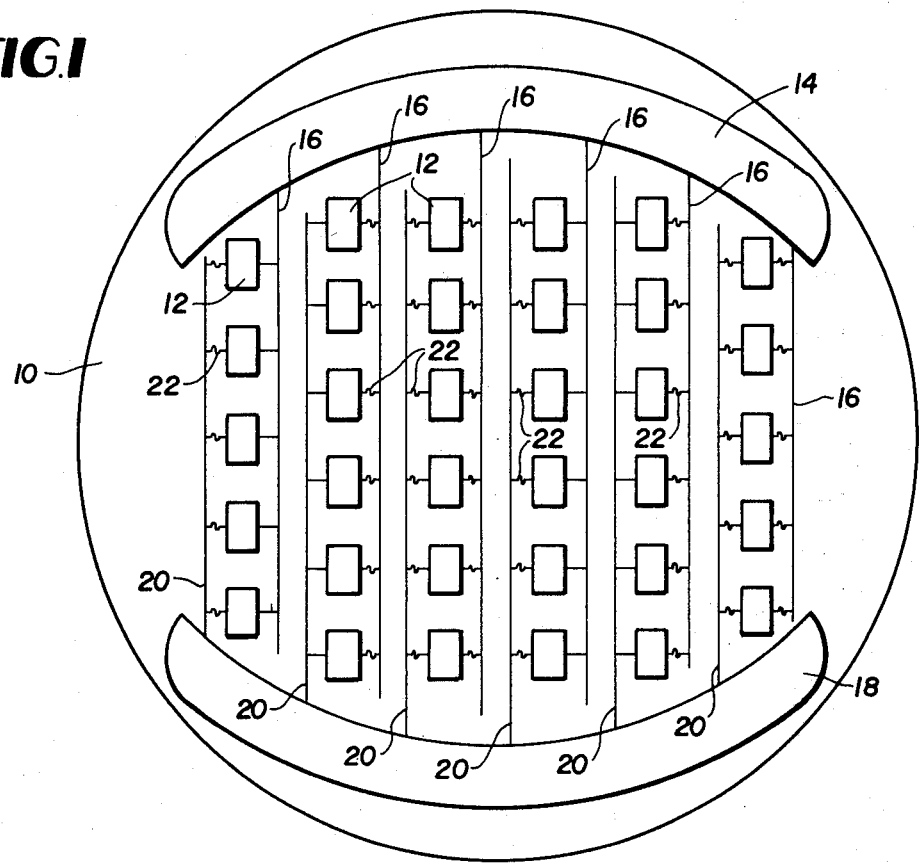
FIG. 1 is a diagrammatic top view of an integrated circuit wafer incorporating the principles of the present invention.

FIG. 1 shows an integrated circuit wafer 10 having a plurality of integrated circuit dice 12 thereon. In addition to the metallization on the integrated circuit die, the present invention includes two sets of conductors having two distinct terminals or electrodes. The first set of conductors includes a terminal or electrode 14 and a plurality of substantial parallel conductors 16 extending therefrom. The second set of conductors includes a terminal or electrode 18 having a plurality of substantially parallel conductors 20 extending therefrom. The integrated circuits on the dice 12 are each connected to each of the conductor systems 16 and 20. The interconnection of at least one of the conductors to the integrated circuit of the dies is through a fusible element 22. As illustrated in FIG. 1, the integrated circuit dice may be connected by a single fusible element 22 extending from conductor 20 as in column one or from the conductor 16 as in column two. Similarly as illustrated in column three, the conductors 16 and 20 may both be connected to the individual integrated circuit dice by fusible elements 22. Since sets of conductors are biased during environmental qualification, the fusible element will blow and disconnect all integrated circuit dice which have a short therein. This will prevent the other commonly connected dice also from being improperly biased during the environmental qualification. Since the dice are connected and biased between conductors 16 and 20, only one fuse is needed, though connecting each of the conductors to the dice through a fuse is preferred.

Figure 2:
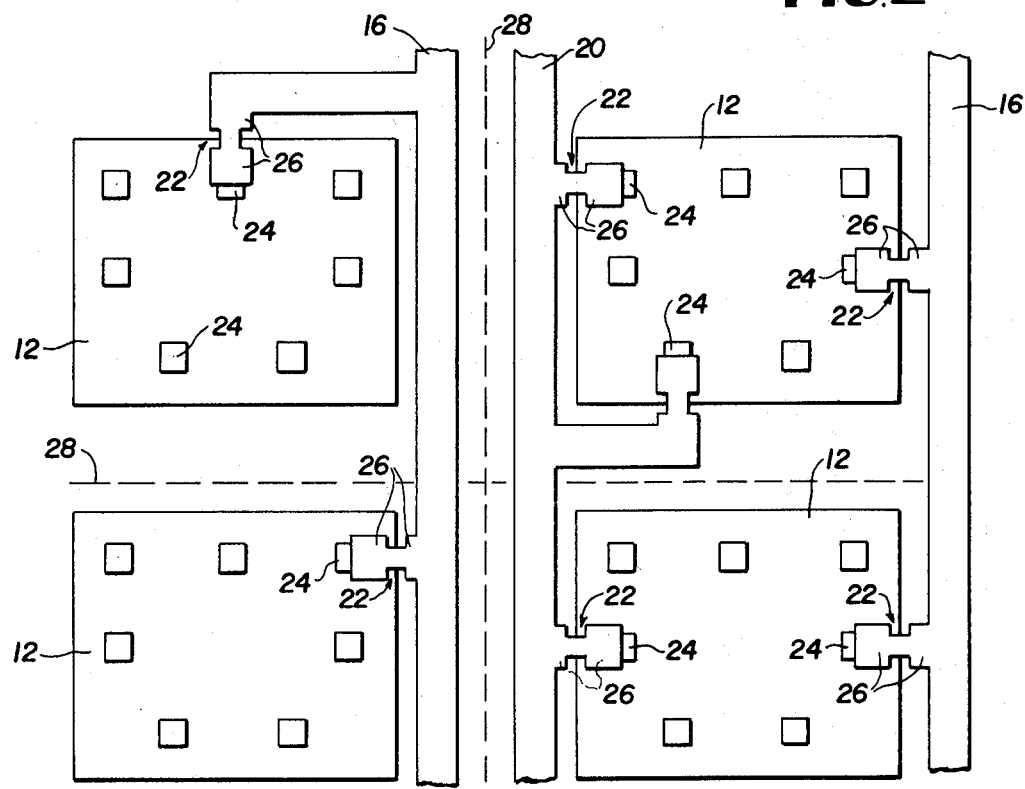
FIG. 2 is an enlarged, detailed, fragmentary top structure of a portion of FIG. 1.

As illustrated, more explicitly in enlarged view of FIG. 2, each of the integrated circuit dice includes contact pads 24 therein. The fuse 22 is an extension of the conductors 16 and 20 and has enlarged probe pads 26 at each end of the fusible element. This will be important during the described method of the present invention. It should also be noted that the conductors 16 and 20 are formed in the region between the dice of 12 in which the wafer will be scribed and broken into individual dice. The scribe lines are illustrated in phantom as dotted line 28.

The test procedure begins by applying a voltage across terminals 14 and 18 to bias all the dice 12 on the wafer 10. While the dice are biased, the wafer is subjected to the qualifying environment for the appropriate time. After the exposure, the individual fusible elements 22 are tested or probed using probe pads 26. The dice having the defective fusible elements which were initially defective or blown during the biasing period are marked with a dot of ink. This is followed by the removal of conductors 16 and 20. The individual circuits of the dice 12 are then tested, and those which fail to meet preselected performance characteristics are marked with a dot of ink. The removal of the common conductors 16 and 20 prevents any electrical interconnection of the integrated circuits of the individual dice during the circuit testing of another die. The wafer is then scribed along lines 28 and broken into individual dice. The uninked dice are then segregated from the inked dice and assembled into appropriate housings.

The test procedure for biased burned-in test qualification, begins with applying a voltage across terminals 14 and 18 to bias all the dice 12 on the wafer 10. While the dice are biased, the wafer is subjected to a high temperature burn-in environment of, for example, 125° C. for an extended period, for example, 168 hours. The temperature may be in the range of 125° C. to 135° C. for periods in the range of 168 hours to 117 hours respectively as set forth in MIL-STD 883-B, Method 1015.2. The individual fusible elements 22 on the wafer are tested using probe pads 26 and the dice having disconnected or defective fusible elements are marked with a dot of ink. This indicates that either the die was not biased during the high temperature burn-in or a short blew the fusible element and the circuit is defective. After the fusible element probe, the conductors 16 and 18 are removed and the individual circuits of the dice 12 are tested. Those circuits which fail to meet the preselected performance characteristics are also marked with a dot of ink. The wafer is then scribed along lines 28 and broken into individual dice. The uninked dice are then segregated from the inked dice and assembled into appropriate housings or circuits.

To form the conductor system of the present invention which is required so as to perform the environment qualification or testing of circuits while being biased, very little additional processing or materials are needed. After the wafer has completed standard processing to form the devices of the integrated circuits, the contact aperture mask, modified so as not to include the scribe lines and contact apertures beneath the to-be-formed terminals 14 and 18, is used to form the contact apertures in the insulative layer over the wafer. A metallic layer is then provided over the wafer and delineated to form the electrodes 14 and 18, conductors 16 and 20 and fusible elements 22. The fusible elements 22 are formed from the same material, for example, aluminum, which forms the conductor systems as well as the conductors and innerconnects on the integrated circuits on the individual dice 12. A separate mask is used to remove the conductors 16 and 20 and the insulative layer to expose the areas which will be scribed to facilitate breaking of the wafer into the plurality of dice. Since the conductors are to be removed after the exposure to the qualifying environment, the same mask is used to also remove the insulative layer from the areas of the wafer between the dice which are to be scribed. Thus forming the conductors 16 and 20 over the scribe line area reduces the number of mask and masking steps and requires dedication of no additional wafer surface area. Thus, the present process merely requires modifying the aperture mask to remove the scribe lines and eliminate the contact apertures below the terminals 14 and 18, adding the conductors, terminals and fusible elements to the metallization mask and making a separate scribe line mask. Since the masking information is readily available, no additional expense is needed to derive the additional information for the mask for the present process. Similarly, the process only includes one additional sequence to remove the conductors and expose the scribe areas and consequently will not increase the expense of producing a wafer which is capable of biased burn-in qualification.

From the preceding description of the preferred embodiment, it is evident that the objects of the invention are attained in that a plurality of biased integrated circuits can be qualified at the wafer level. Although the invention has been described and illustrated in detail it is to be clearly understood that the same is by way of illustration and example only and is not to be taken by way of limitation. Other types of tests may be performed which would require biasing, for example total dose gamma radiation, and thus the specially prepared wafer and method described would be equally applicable to these types of tests also. The spirit and scope of this invention are to be limited only by the terms of the appended claims.

What is claimed:

1. A method for qualifying biased burn-in integrated circuits at a wafer level comprising:
    forming a first and a second discrete conductor on said wafer, each connected to each die on said wafer and at least one of said conductors being connected to each die by a fusible element;
    electrically biasing said conductors;
    heating said wafer at a high, burn-in temperature while electrically biased;
    testing the condition of the fusible elements and marking defectively connected dice;
    removing said conductors; and
    testing the circuitry on said dice and marking defective dice.

2. A method according to claim 1 wherein said heating is at a temperature in the range of 125° C. to 135° C. for a period in the range of 168 to 117 hours respectively.

3. A method according to claim 1 wherein forming said conductors includes forming contact apertures in an insulative layer of the wafer, forming conductors on said insulative layer, and interconnecting said conductors and said dice via said apertures with said fusible elements.

4. A method according to claim 3 including removing said insulative layer underlying said conductors to expose scribe areas of the wafer and breaking said wafer into dice after the circuit testing.

5. A method for qualifying biased burned-in integrated circuits at the wafer level comprising:
    forming a first plurality of conductors on a wafer connected to a first electrode;
    forming a second plurality of connectors on said wafer connected to a second electrode;
    interconnecting each dice on said wafer to at least one conductor of each of said first and second plurality of conductors by at least one fusible element per die;
    electrically biasing said dice on said wafer via said electrodes;
    heating said wafer at a sufficiently high temperature for a sufficient amount of time to perform a burn-in while electrically biased;

testing said fusible elements and marking defectively connected dice; and testing the circuit on said dice and marking defective circuits.

6. The method according to claim 5 wherein forming said first and second plurality conductors and first and second electrodes includes forming contact apertures in an insulative layer of said wafer to all contact points of the circuits on said dice except for the area over which the first and second electrodes will be formed, and applying a conductive layer to said wafer and patterning said conductive layer to form said conductors, electrodes and fusible elements.

7. The method according to claim 6 wherein said conductive layer is patterned such that said first and second plurality of electrodes lie over the area between the dice.

8. A method according to claim 7 including removing said conductors and the underlying insulative layer to expose the scribe areas of the wafers between said dice before circuit testing and breaking said wafer into said die after circuit testing.

9. A method according to claim 5 including removing said first and second plurality of conductors after fusible element testing and before circuit testing.

10. A method according to claim 5 wherein said temperature of burn-in the range of 125° C. to 135° C. and the period of burning is in the range of 168 hours to 117 hours respectively.

* * * * *